(12) United States Patent
Han et al.

(10) Patent No.: US 6,660,599 B2
(45) Date of Patent: Dec. 9, 2003

(54) SEMICONDUCTOR DEVICE HAVING TRENCH ISOLATION LAYER AND METHOD FOR MANUFACTURING THE SAME

(75) Inventors: Myoung-sik Han, Suwon (KR); Kyoung-hyun Kim, Seoul (KR)

(73) Assignee: Samsung Electronics Co., Ltd., Kyungki Do (KR)

( * ) Notice: Subject to any disclaimer, the term of this patent is extended or adjusted under 35 U.S.C. 154(b) by 188 days.

(21) Appl. No.: 09/826,255

(22) Filed: Apr. 4, 2001

(65) Prior Publication Data

US 2002/0014677 A1 Feb. 7, 2002

(30) Foreign Application Priority Data

Jul. 26, 2000 (KR) ........................................ 2000-43008

(51) Int. Cl.[7] ............................................. H01L 21/336
(52) U.S. Cl. ........................ 438/296; 438/207; 438/218; 438/221; 438/294
(58) Field of Search .................. 257/506, 513, 257/510, 514, 515; 438/424, 425, 430, 431, 435, 437, 207, 208, 218, 219, 221, 248, 359, 391, 225, 294, 296, 281, 427

(56) References Cited

U.S. PATENT DOCUMENTS

| | | | | |
|---|---|---|---|---|
| 4,307,180 A | * | 12/1981 | Pogge ........................ 438/424 |
| 5,578,518 A | * | 11/1996 | Koike et al. ................ 438/424 |
| 5,886,391 A | * | 3/1999 | Niroomand et al. ........ 257/510 |
| 5,888,881 A | * | 3/1999 | Jeng et al. ................... 438/425 |
| 5,994,201 A | * | 11/1999 | Lee ............................. 438/427 |
| 6,127,241 A | * | 10/2000 | Rha ............................ 438/437 |
| 6,137,152 A | * | 10/2000 | Wu ............................. 257/510 |
| 6,150,273 A | * | 11/2000 | Liu et al. .................... 438/692 |
| 6,221,736 B1 | * | 4/2001 | Gau ............................ 438/435 |
| 6,251,746 B1 | * | 6/2001 | Hong et al. ................. 438/424 |
| 6,255,194 B1 | * | 7/2001 | Hong .......................... 438/435 |
| 6,258,692 B1 | * | 7/2001 | Chu et al. ................... 438/437 |
| 6,265,282 B1 | * | 7/2001 | Lane et al. .................. 438/424 |
| 6,331,469 B1 | * | 12/2001 | Park et al. ................... 438/296 |
| 6,333,242 B1 | * | 12/2001 | Hwang et al. .............. 438/435 |

FOREIGN PATENT DOCUMENTS

JP 54-16189 * 2/1979 ................ 21/76

* cited by examiner

Primary Examiner—Tom Thomas
Assistant Examiner—Quang Vu
(74) Attorney, Agent, or Firm—F. Chau & Associates, LLP

(57) ABSTRACT

A semiconductor device is formed by including the step of forming a polycrystalline silicon layer on a semiconductor substrate which includes a pad oxide. A trench is formed in the semiconductor substrate by etching sequentially a part of the polycrystalline silicon layer, a part of the pad oxide layer, and a part of the semiconductor substrate. An oxide layer spacer is formed on the walls of the trench and the side walls of the etched pad oxide layer and the etched polycrystalline silicon layer. A nitride liner is formed on the oxide layer spacer. The trench is filled with an insulating layer on the nitride liner and the insulating layer is planarized until the polycrystalline silicon layer is exposed. And then the polycrystalline silicon layer is dry-etched.

6 Claims, 4 Drawing Sheets

SEMICONDUCTOR DEVICE HAVING TRENCH ISOLATION LAYER AND METHOD FOR MANUFACTURING THE SAME

BACKGROUND OF THE INVENTION

1. Field of the Invention

The present invention relates to a semiconductor device having an isolation layer, and more particularly, to a semiconductor device having an isolation layer formed using a trench and a method for manufacturing the same.

2. Description of Related Art

As integration density of semiconductor integrated circuits increases, circuit components such as transistors are formed closer to each other and reliability of the circuits can reduced unless effective isolation techniques for separating devices such as MOS transistors next to each other are employed. A trench isolation technique which can form an isolation region having a narrow width is widely used in the manufacture of a highly integrated semiconductor device. Other conventional isolation methods include local oxidation of silicon (LOCOS).

FIGS. 1A through 1C illustrate a conventional trench isolation technique.

Referring to FIG. 1A, a pad oxide layer 12 and a silicon nitride layer 14 are sequentially formed on a semiconductor substrate 10, that is on the whole surface of a silicon substrate, and then a photoresist layer is formed. Here, the silicon nitride layer 14 is used as a blocking layer during the chemical mechanical polishing(CMP), and it is preferable that the silicon nitride layer is formed with a sufficient thickness in order that an active region is not damaged by the polishing process. A mask 16, which covers the substrate corresponding to the active region, is formed on the upper portion of the silicon nitride layer 14 by patterning the photoresist layer using a general photolithography process. The portion in which the mask 16 is not formed is an area for forming a trench to define an isolation region.

The silicon nitride layer 14 and the pad oxide layer 12 are etched using the mask 16, and patterns 14a and 12a are formed. Then, the photo mask 16 is removed, and a high temperature thermal oxide layer 19 having a thickness of 1200 Å is formed on the silicon nitride layer pattern 14a and patterned. Using the patterned high temperature thermal oxide layer 19 as a shield, the semiconductor substrate 10 is etched and a trench 15 as shown in FIG. 1B is formed. The thickness of the high temperature thermal oxide layer 19 is reduced to 300 Å during the trench forming process. Next, an oxide layer spacer 17 is formed by a thermal oxidation process on the walls of the trench 15. In order to prevent the deterioration of a refresh feature of a semiconductor device due to pitting caused by the oxidation of the walls of the trench, a nitride liner 18 is coated on the exposed surface including the thermal oxide layer 19, the silicon nitride layer pattern 14a, and oxide layer spacer 17. The inside of the trench is filled with an insulating material such as an undoped silicate glass (USG), a tetraethylortho silicate (TEOS), a borosilicate glass (BSG), a borophosphosilicate glass (BPSG), and a phosphosilicate glass (PSG), to form an insulating layer 20. The insulating layer 20 plays the part of separating devices for insulating the active regions, and is planarized by CMP as shown in FIG. 1C. The CMP process of the insulating layer filling up the trench 15 is performed until the surface of the silicone nitride layer 14a exposed to act as a blocking layer, and then an insulating layer pattern 20a is formed.

In order to expose the surface of the semiconductor substrate 10 used as the active region, the silicon nitride layer pattern 14b is removed using phosphoric acid, and the pad oxide layer pattern 12a is removed by wet etching. The silicone nitride layer pattern 14b indicates a layer having a reduced thickness compared with the silicon nitride layer pattern 14a by the CMP.

The etch blocking layer, i.e. the silicon nitride layer pattern 14b located in the boundary between the isolation region and the active region after the CMP, and the planarized insulating layer pattern 20a are indicated with reference numeral 30, and are magnified and illustrated in FIG. 2A. The nitride liner 18a is disposed among the oxide layer spacer 17, the silicon nitride layer pattern 14b, and the insulating layer pattern 20a. Since the silicon nitride layer pattern 14b is in contact with the nitride liner 18a, when the silicon nitride layer pattern 14b is removed using phosphoric acid, the silicon nitride layer pattern 14b and the nitride liner 18a are exposed to the phosphoric acid and are etched. Therefore, the insulating layer pattern 20a around the nitride liner 18a is exposed to the phosphoric acid, and a recess 40 as shown in FIG. 2B is formed. Then, the pad oxide layer pattern 12b (which indicates a layer having a reduced thickness compared with the pad oxide layer 12a from exposure to the phosphoric acid) is removed by wet etching, and a filled recess margin is reduced, so that a retreated recess 45 retreated further toward the isolation region than the recess 40 of FIG. 2B as shown in FIG. 2C, is formed. These recesses 40 and 45 cause a leakage current in a semiconductor device, and cause a reduction of an etching margin when a gate electrode is formed in the active region. A problem arises when a gate electrode pattern cannot be completely etched due to the recesses, and a current bridge can be formed between conductors of the semiconductor device.

SUMMARY OF THE INVENTION

To solve the above problems, it is an objective of the present invention to provide a semiconductor device and a method having a trench isolation layer which solves the above problems.

According to an aspect of the invention, a polycrystalline silicon(a.k.a. polysilicon) layer is formed on a semiconductor substrate on which a pad oxide layer is formed. A part of the polycrystalline silicon layer, a part of the pad oxide layer, and a part of the semiconductor substrate are sequentially etched, and a trench is formed on the semiconductor substrate. Then, an oxide spacer is formed on the walls of the trench and the side walls of the etched pad oxide layer and the polycrystalline silicon layer. After a nitride liner is formed on the oxide layer spacer, the inside of the trench is filled with an insulating layer and planarized the insulating layer such that the polycrystalline silicon layer is exposed and then the polycrystalline silicon layer is dry-etched.

According to a preferred aspect of the present invention, the step of forming the oxide layer spacer may comprise the step of performing by a thermal oxidation process.

While the selectivity of the oxide spacer with respect to the nitride liner is maintained about 1:1, two-step dry etching is performed on the polycrystalline silicon layer, and then the pad oxide layer is removed by wet etching. Here, the two-step dry etching includes a first step of actually removing the polycrystalline silicon layer with an etchant having the polycrystalline silicon layer with the relatively low first selectivity with respect to the pad oxide layer, for example about 10 through about 20, and a second step of etching back the pad oxide layer with an etchant having the second selectivity with respect to the pad oxide layer higher than the first selectivity, for example about 50 through about 100 in order to completely remove the polycrystalline silicon layer which may remain on the pad oxide layer.

Furthermore, the isolation method may further comprise a step of forming an oxide layer on the polycrystalline silicon layer covering non-etched part of the polycrystalline silicon layer before forming the oxide layer spacer.

A semiconductor device manufactured by the described method is also provided which includes: a semiconductor substrate having a trench; and an isolation region filling the trench and having a portion extending from the trench to the semiconductor substrate, wherein the isolation region includes the oxide layer spacer formed on the walls and the bottom of the trench, the nitride liner formed on the upper portion of the oxide layer spacer, and the insulating layer formed on the nitride liner. And an end of the nitride liner preferably contacts with upper surface of the isolation region.

BRIEF DESCRIPTION OF THE DRAWINGS

The advantages of the present invention will become more apparent by describing in detail preferred embodiments thereof with reference to the attached drawings in which.

DETAILED DESCRIPTION OF PREFERRED EMBODIMENTS

Hereinafter, the present invention will be described in detail with reference to FIGS. 3A through 3C.

Figure 1A:
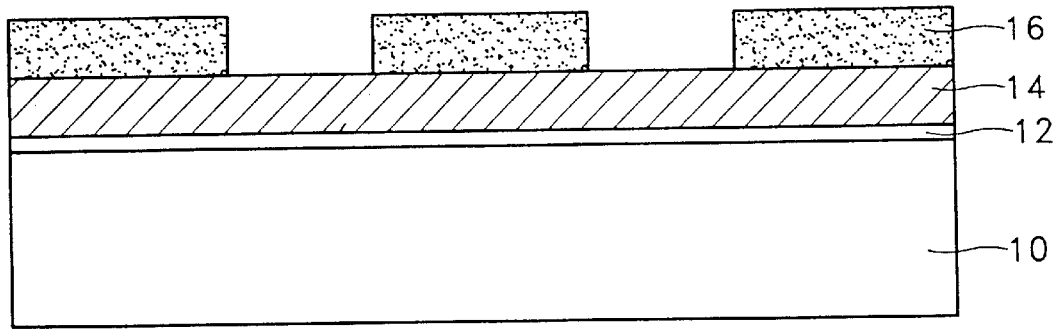
FIGS. 1A through 1C and FIGS. 2A through 2C are sectional views of structures which illustrate a conventional method for separating a semiconductor device using a trench.
Figure 1B:
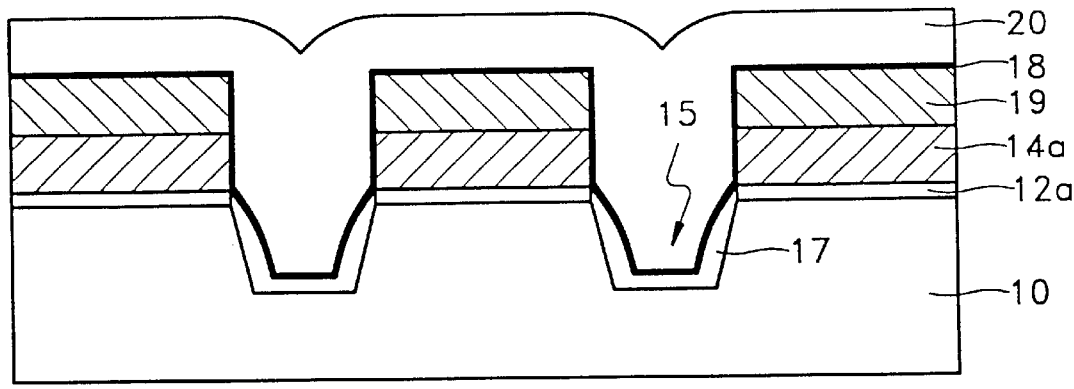
Figure 1C:
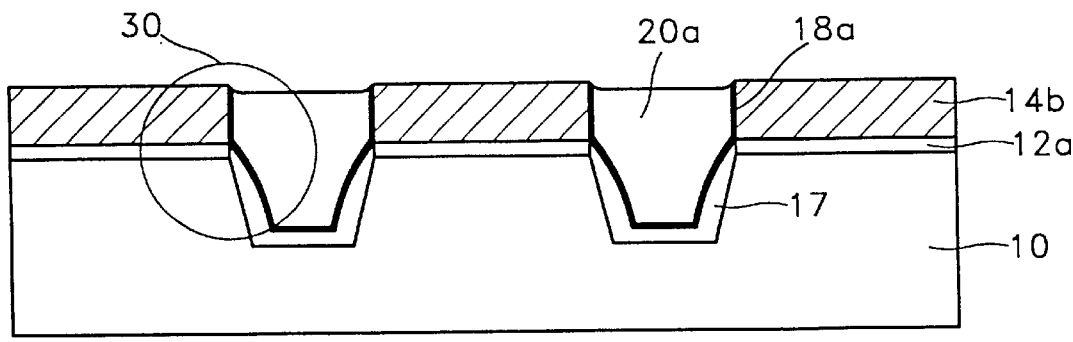

While a silicon nitride layer 14 (FIG. 1A) is used as a blocking layer in the chemical mechanical polishing (CMP) process according to the prior art, a polycrystalline silicon layer 114 is used as a blocking layer in the CMP process in a preferred embodiment of the present invention. Also, instead of employing a wet etching method using phosphoric acid for removal of a blocking layer, a dry etching method is used. To prevent pitting of a pad oxide layer, a blocking layer formed of polycrystalline silicon is made to have a selectivity with respect to the pad oxide layer of about 50 through about 100.

Figure 3A:
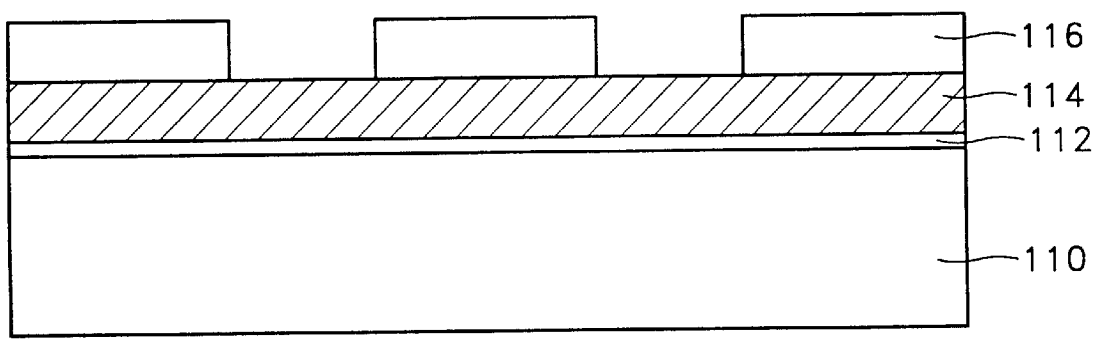
FIGS. 3A through 3C and FIGS. 4A through 4C are sectional views of structures which illustrate a method for separating a semiconductor device using a trench according to the present invention.

As illustrated in FIG. 3A, a pad oxide layer 112, and a polycrystalline silicon layer 114 are sequentially formed on a semiconductor substrate 110, preferably on a silicon substrate. The polycrystalline silicon layer 114 is used as a blocking layer during a polishing process, and a sufficient thickness is formed so as not to damage an active region with the polishing process. After a photoresist is coated on the polycrystalline silicon layer 114 to form an isolation trench and then patterned, a mask 116 is formed. As described in the prior art, the portion in which the mask 116 is formed corresponds to the active region, and the portion in which the mask is not formed is where the isolation trench will be formed.

Figure 3B:
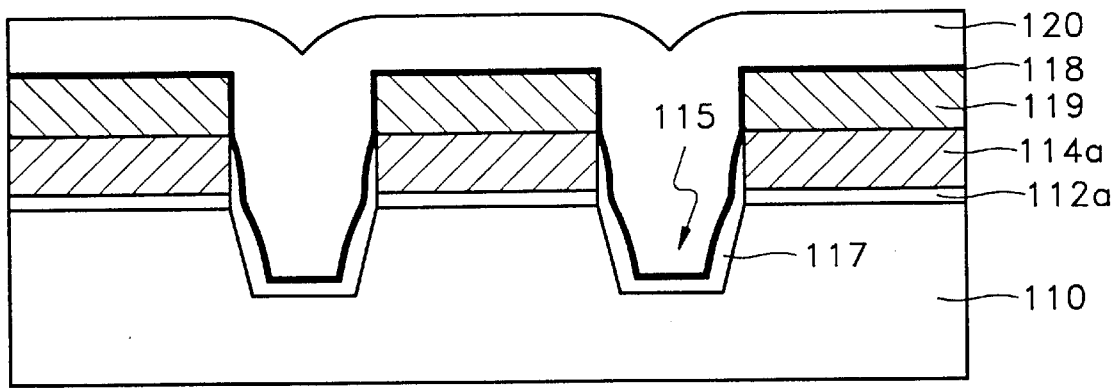

As illustrated in FIG. 3B, a polycrystalline silicon layer pattern 114a and a pad oxide layer pattern 112a are formed by etching the polycrystalline silicon layer 114 and the pad oxide layer 112 using the mask 116 as a shield in FIG. 3A. After removing the mask 116, a high temperature thermal oxide layer 119 is formed on the polycrystalline silicon layer pattern 114a, and a mask (not shown) for a trench is formed. A trench 115 having a predetermined depth is formed by etching the high temperature thermal oxide layer 119 and the semiconductor substrate 110 using the trench mask. As described above, a part of the high temperature thermal oxide layer 119 is removed during the formation of the trench.

Then, a thermal oxidation process is performed on the exposed surface and an oxide layer spacer 117 is formed on the walls of the trench 115 and the side walls of the pad oxide layer pattern 112a and the polycrystalline silicon layer pattern 114a. In the prior art, a silicon nitride layer is used as a stopping layer, so that a silicon oxide layer spacer is formed only on the walls of the trench by a thermal oxidation process after forming the trench. According to an embodiment of the present invention, a polycrystalline silicon layer pattern 114a is used as a stopping layer, and the oxide layer spacer 117 is also formed on the side walls of the polycrystalline silicon layer pattern 114a by oxidation. And then, a nitride liner 118 is coated on the whole surface of the result having the oxide layer spacer 117, and the inside of the trench is filled with an insulating material 120.

Figure 3C:
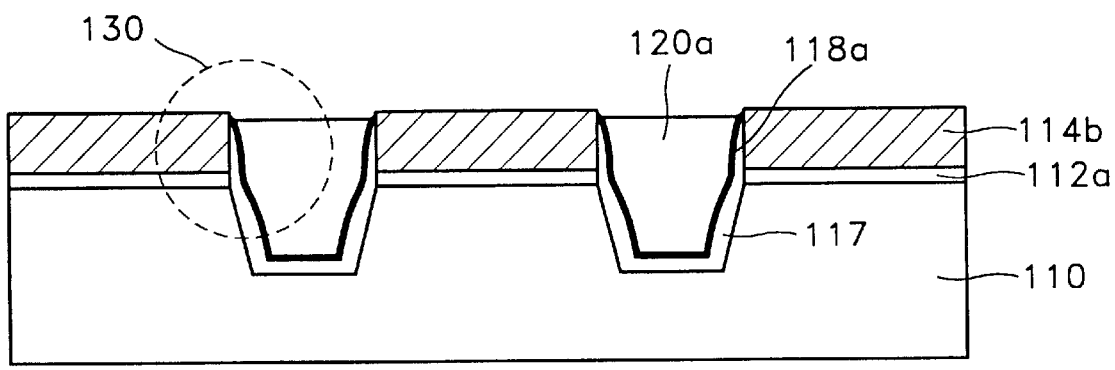

To planarize the semiconductor device shown in FIG. 3B, the CMP is performed thereon until the insulating layer 120 filling the inside of the trench is planarized as shown in FIG. 3C, and then an insulating layer pattern 120a is formed.

To use a polycrystalline silicon layer pattern 114a as blocking layer, slurry for polishing the polycrystalline silicon with a high selectivity with respect to the insulating material 120 is used. Preferably, the selectivity of the polycrystalline silicon with respect to the insulating material 120 is higher than 1:5. Since the polycrystalline silicon layer pattern 114b (the polycrystalline silicon layer pattern 114b having a reduced thickness compared with the polycrystalline silicon layer pattern 114a from polishing) is formed on the pad oxide layer 112a. The oxide layer spacer 117 is formed on the side walls of the polycrystalline silicon layer pattern 114b, the etch blocking layer, i.e., the polycrystalline silicon layer pattern 114b, is separated by oxide layer spacer 117 and is not directly contacted to the nitride liner 118a.

Figure 4A:
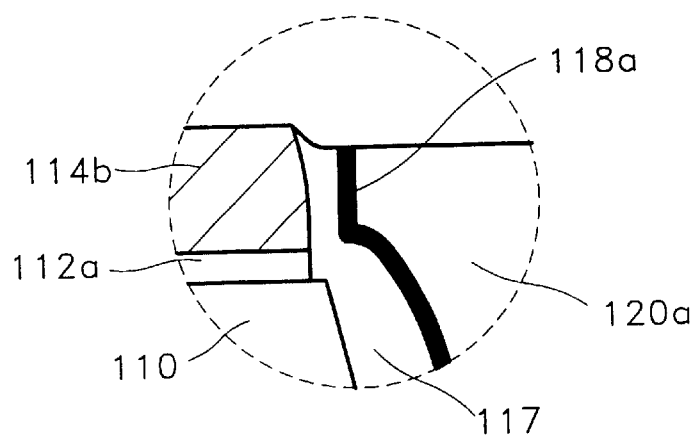

The state of the insulating layer pattern 120a and the polycrystalline silicon layer pattern 114b in the boundary between the isolation regions and the active region after polishing is indicated by reference numeral 130, and is magnified and illustrated in FIG. 4A.

Figure 4B:
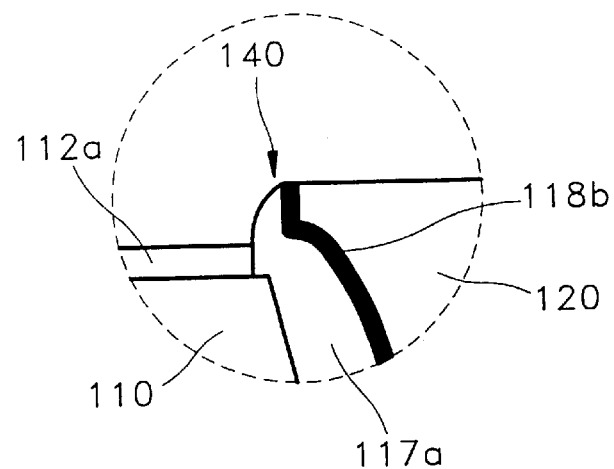
Figure 4C:
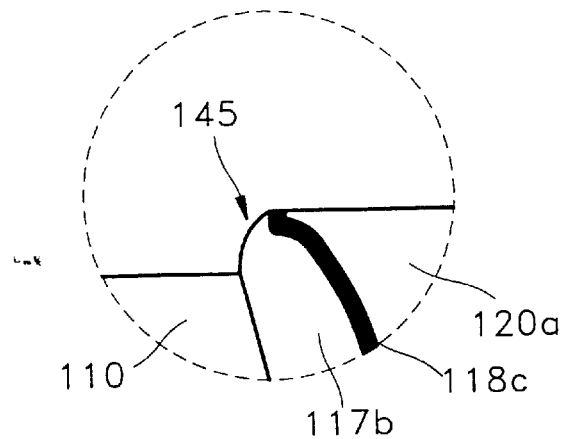

To open the active region, an etch back process is applied to the polycrystalline silicon layer pattern 114b. The etch back process uses an end point detector, and preferably includes two steps. In a first step, almost all the polycrystalline silicon layer pattern 114b is removed by etching with an etchant. The etchant preferably has a relatively low selectivity of the pad oxide layer pattern 112a with respect to the polycrystalline silicon, e.g., 1:10 through 1:20. A part of the oxide layer spacer 117 which is contacted to the polycrystalline silicon layer pattern 114b has a "negative" profile as shown in FIG. 4A. A second step of the etch back process is performed for preventing pitting of the pad oxide layer and for completely removing the polycrystalline silicon layer which can remain on the upper surface of the pad oxide layer pattern 112a, and adapts an etchant having the high selectivity of the pad oxide layer pattern 112a with respect to the polycrystalline silicon layer pattern 114b of about 1:50 through about 1:100. Upon completion of the second step of the etch back process, the corner of the spacer between the nitride liner 118a and the polycrystalline silicon layer pattern 114b of FIG. 4A is rounded as illustrated in FIG. 4B. Here, in the first and second steps, the selectivity of the oxide layer with respect to the nitride liner is maintained at about 1:1. Then, the pad oxide layer 112a is removed by wet etching. After wet etching of the pad oxide layer 112a, the oxide layer spacer 117b has a round corner 145 as shown in FIG. 4C.

Figure 2A:
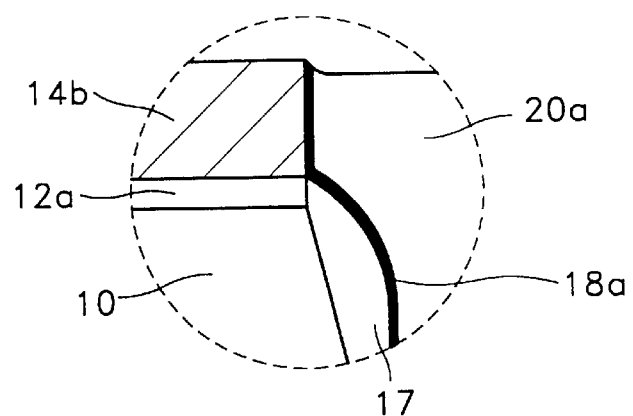
Figure 2B:
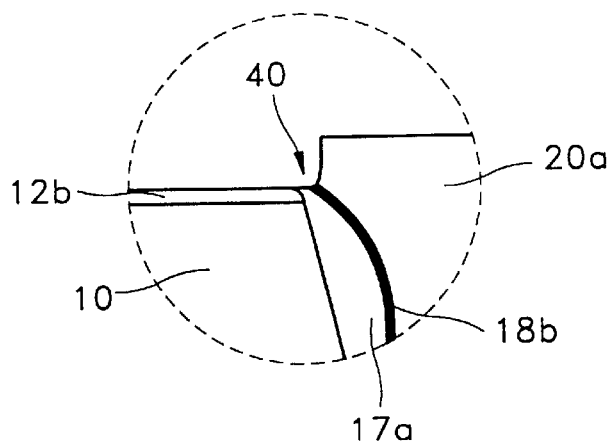
Figure 2C:
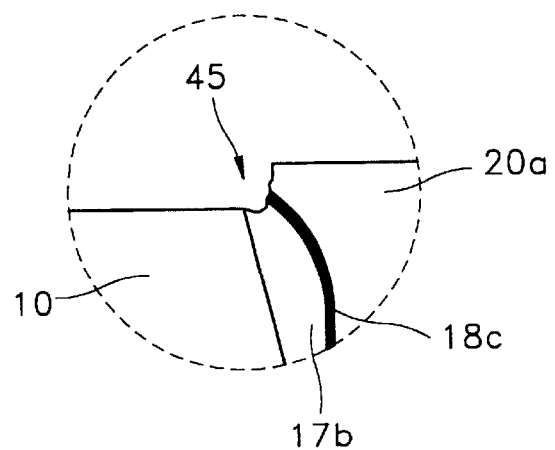

Advantageously, using the above described method, there is provided a semiconductor device which preferably includes a semiconductor substrate 110 having a trench, and an isolation region filling the trench and having a portion extending from the trench to above the semiconductor substrate 110. The isolation region includes an oxide layer spacer 117b formed on the walls and the bottom of the trench, a nitride liner 118c formed on the oxide layer spacer 117b, and an insulating layer 120a formed on the nitride liner 118c. And according to the present invention, an end of the nitride layer 118c preferably contacts with the upper surface of the isolation region to form a bulge 145. The bulge 145 extends outwardly from the oxide layer spacer 117b as shown and acts to prevent any leakage current that may flow from gaps that may exist between the substrate and an active region, such as can be seen in recess 45 in FIG. 2C.

In the trench isolation technique according to a preferred embodiment of the present invention, the oxide layer spacer is formed by thermal oxidation not only on the inside walls of the trench but also on the side walls of the polycrystalline silicon layer pattern by using polycrystalline silicon as the polishing blocking layer for performing CMP on the semiconductor device in which the trench is filled with the insulating material, and the dry etching method, the etch back process, is adapted during the removal of the polycrystalline silicon layer pattern. Therefore, after the removal of the blocking layer, the polycrystalline silicon layer pattern and the pad oxide layer thereunder, the field recess margin is secured, so that no bridge to a gate electrode can be formed, and no leakage current flows through the gate. Also, in the second etching step, the dry etching is performed with an etchant having the higher selectivity than the first etching step, so that pitting of the pad oxide layer on the lower portion of the polycrystalline silicon layer pattern can be prevented.

Although the present invention has been described herein with reference to the accompany drawings, it is to be understood that the present invention is not limited to those precise embodiments, and various other changes and modifications may be affected therein by one skilled in the art without departing from the scope or sprit of the present invention. All such changes and modifications are intended to be included within the scope of the invention as defined by the appended claims.

What is claimed is:

1. An isolation method comprising the steps of:

forming a polycrystalline silicon layer on a semiconductor substrate on which a pad oxide layer is formed;

forming a trench in the semiconductor substrate by etching sequentially a part of the polycrystalline silicon layer, a part of the pad oxide layer, and a part of the semiconductor substrate;

forming an oxide layer spacer on the walls of the trench and the side walls of the etched pad oxide layer and the etched polycrystalline silicon layer;

forming a nitride liner on the oxide layer spacer;

filling the trench with an insulating layer on the nitride liner;

planarizing the insulating layer such that the polycrystalline silicon layer is exposed; and dry-etching the polycrystalline silicon layer, wherein the step of dry-etching comprises a first step of removing the polycrystalline silicon layer by etching back the polycrystalline silicon layer with an etchant having the first etching selectivity of the pad oxide layer with respect to the polycrystalline silicon layer, and a second step of etching back the polycrystalline silicon layer with an etchant having the higher second selectivity than the first selectivity of the pad oxide layer with respect to the polycrystalline silicon layer to remove the polycrystalline silicon layer remaining on the pad oxide layer, and a rounded bulge is formed on an upper portion of an isolation region above the substrate.

2. The method of claim 1, wherein the step of forming the oxide layer spacer comprises the step of performing by a thermal oxidation process.

3. The method of claim 1, wherein the step of dry-etching the polycrystalline silicon layer comprises the step of maintaining the selectivity of the oxide layer spacer with respect to the nitride liner about 1:1 under an etchant.

4. The method of claim 1, wherein the first etching selectivity is about 1:10 through about 1:20 and the second etching selectivity is about 1:50 through about 1:100.

5. The method of claim 1, an isolation method further comprising a step of forming an oxide layer on the polycrystalline silicon layer covering non-etched part of the polycrystalline silicone layer before forming the oxide layer spacer.

6. The method of claim 1, wherein the isolation region comprises:

an oxide layer spacer formed on the walls and the bottom of the trench, a nitride liner formed on the oxide layer spacer, and an insulating layer formed on the nitride liner extending above the substrate.

* * * * *